US012618879B2

(12) United States Patent
Lindell et al.

(10) Patent No.: US 12,618,879 B2
(45) Date of Patent: May 5, 2026

(54) MONITORING ARRANGEMENT AND METHOD FOR MONITORING A SURGE

(71) Applicant: HITACHI ENERGY LTD, Zürich (CH)

(72) Inventors: Elisabeth Lindell, Västerås (SE); Stefan Halen, Västerås (SE)

(73) Assignee: HITACHI ENERGY LTD, Zurich (CH)

( * ) Notice: Subject to any disclaimer, the term of this patent is extended or adjusted under 35 U.S.C. 154(b) by 231 days.

(21) Appl. No.: 18/561,204

(22) PCT Filed: May 17, 2021

(86) PCT No.: PCT/EP2021/062922
§ 371 (c)(1),
(2) Date: Nov. 15, 2023

(87) PCT Pub. No.: WO2022/242819
PCT Pub. Date: Nov. 24, 2022

(65) Prior Publication Data
US 2024/0255550 A1 Aug. 1, 2024

(51) Int. Cl.
*G01R 19/165* (2006.01)
*H02H 9/04* (2006.01)

(52) U.S. Cl.
CPC ......... *G01R 19/16571* (2013.01); *H02H 9/04* (2013.01)

(58) Field of Classification Search
CPC ............................ G01R 19/16571; H02H 9/04
See application file for complete search history.

(56) References Cited

U.S. PATENT DOCUMENTS

| | | | | |
|---|---|---|---|---|
| 11,569,656 | B2 * | 1/2023 | Thompson | ............... H02H 9/02 |
| 2004/0085696 | A1 * | 5/2004 | Mendoza | ............... H02H 3/048 |
| | | | | 361/93.1 |
| 2011/0299210 | A1 * | 12/2011 | Wang | ..................... H02H 9/007 |
| | | | | 361/118 |
| 2014/0176336 | A1 * | 6/2014 | Li | ........................... G01R 31/52 |
| | | | | 340/870.01 |
| 2018/0017610 | A1 * | 1/2018 | Phillips | .............. G01R 31/1236 |

FOREIGN PATENT DOCUMENTS

| | | |
|---|---|---|
| CN | 110514994 A | 11/2019 |
| EP | 3193178 A1 | 7/2017 |
| EP | 3457147 A1 | 3/2019 |

OTHER PUBLICATIONS

International Search Report and the Written Opinion of the International Searching Authority, International Application No. PCT/EP2021/062922, mailed Jan. 31, 2022, 13 pages.

* cited by examiner

*Primary Examiner* — Scott Bauer
(74) *Attorney, Agent, or Firm* — Sage Patent Group

(57) ABSTRACT

A monitoring arrangement for monitoring a surge through a surge arrester, the surge arrester being adapted to be connected to a power network in order to protect an electrical equipment of the power network against incoming surges passing through the surge arrester. The monitoring arrangement detects a reignition surge, which reignition surge has been occasioned by a switching of a circuit breaker. The monitoring arrangement further calculates the number of detected reignition surges.

15 Claims, 7 Drawing Sheets

10. Monitoring arrangement

Communication interface

701. Processing circuitry

707. Memory

10. Monitoring arrangement

702. Detecting unit

703. Calculating unit

704. Producing unit

701. Processing circuitry

707. Memory

709

708

MONITORING ARRANGEMENT AND METHOD FOR MONITORING A SURGE

CROSS REFERENCE TO RELATED APPLICATIONS

This application is a 35 U.S.C. § 371 national stage application of PCT International PCT/EP2021/062922 filed on May 17, 2021, the disclosure and content of which is incorporated by reference herein in its entirety.

TECHNICAL FIELD

The present disclosure relates to the field of measurement of surges and protection of electrical equipment with surge arresters. In particular, the disclosed subject matter relates to a monitoring arrangement for monitoring a surge in a power network.

BACKGROUND

A power transformer is an exemplary power equipment used in an electric grid. Power transformers transform voltage and current in order to transport and distribute electric energy and is a critical power equipment for reliable power distribution in the electric grid. Spontaneous shutdowns in a power network because of failure of such critical power equipment may cause an interruption in power distribution and a large loss of income to a network operator. When a shutdown is caused by damaged or malfunctioning power network components, there will also be additional costs for replacement and/or repair of the network components.

Surge arresters may be used in the power network to protect equipment against transient overvoltages caused by surges occurring in the power network. To enable studies of the actual surges occurring on a specific site, surge arresters may be equipped with surge monitoring devices, for example surge counters.

Surge counters are used to calculate the number of surges that have occurred in a power network and discharged through a particular surge arrester. Surge counters usually count the number of surges, for example surges dues to lightning or/and switching and some of the surge counters may also provide the magnitude of the surges. To understand the surge phenomena and to effectively protect electrical equipment, it is desirable to have more information, for example, the surge waveshapes, its magnitudes, its occurrence and reoccurrence patterns etc., extracted from the surge monitoring devices. Also, such information can be made use in effective protection, condition monitoring and diagnosis of the power equipment (e.g., the power transformer) protected by the surge arresters.

Surges may occur due to circuit breaker switching during certain conditions, e.g., due to reignitions. Reignitions are transient overvoltages caused by internal events, such as switching operations of nearby circuit breakers. A circuit breaker restrike is an abnormal arcing phenomenon, leading to a possible circuit breaker failure.

SUMMARY

The present disclosure presents an improved solution of a monitoring arrangement for surge counting, specifically to count reignitions in a power network.

It is an object of embodiments herein to enhance surge counting in a surge arrester, or at least to achieve an alternative to known solutions within the technical field.

According to an aspect the object is achieved by providing a monitoring arrangement for monitoring a surge through a surge arrester. The surge arrester is adapted to be connected to a power network in order to protect an electrical equipment of the power network against incoming surges passing through the surge arrester. The monitoring arrangement is adapted to detect a reignition surge passing through the surge arrester. The reignition surge has been occasioned by a switching of a circuit breaker.

According to another aspect the above-mentioned object is also achieved by providing a method performed by a monitoring arrangement for monitoring a surge through a surge arrester. The surge arrester is connected to a power network in order to protect an electrical equipment of the power network against incoming surges passing through the surge arrester. The monitoring arrangement detects a reignition surge. The reignition surge has been occasioned by a switching of a circuit breaker.

It is furthermore provided herein a computer program product comprising instructions, which, when executed on at least one processor, cause the at least one processor to carry out the method above, as performed by the monitoring arrangement. It is additionally provided herein a computer-readable storage medium, having stored thereon a computer program product comprising instructions which, when executed on at least one processor, cause the at least one processor to carry out the method according to the method above, as performed by the monitoring arrangement.

The current solution is based on the realisation that by detecting a reignition surge from the burst of reignition surges before activation of a surge arrester protecting a power equipment from surges, where the burst of reignition surges have been occasioned by a switching of a circuit breaker, it will be possible to calculate the number of detected reignition surges. Thereby surge counting in the surge arrester is enhanced with the capability to identify and count reignition surges. The surge counting can then be used to improve assessment of condition of the electrical apparatus protected by the surge arrester and also improve the protection of the electrical apparatus of the power network against incoming surges including reignitions.

Consequently, a monitoring arrangement that detects a reignition surge passing through the surge arrester wherein reignition surge has been occasioned by a switching of said circuit breaker, is achieved.

BRIEF DESCRIPTION OF THE FIGURES

Further technical features of the present disclosure will become apparent through the following description of one or several exemplary embodiments given with reference to the appended figures, where.

It should be noted that the drawings have not necessarily been drawn to scale and that the dimensions of certain elements may have been exaggerated for the sake of clarity.

DETAILED DESCRIPTION

A surge arrester is a device that protects electrical apparatus in a power network from damages, e.g., against overvoltage caused by incoming surges. A typical surge arrester may be connected between a power network and ground, e.g., on a live wire close to the power apparatus. When a surge travels in the power network to the surge arrester, and specifically when the voltage in the live wire reaches a certain overvoltage level because of the incoming surge, the surge arrester will hold the overvoltage level by allowing the electric current to be conducted from the live wire to ground by offering low resistance to the surge, and thus, the electrical apparatus is protected by the surge arrester and is prevented from being subjected to the excessive overvoltage.

Figure 1:
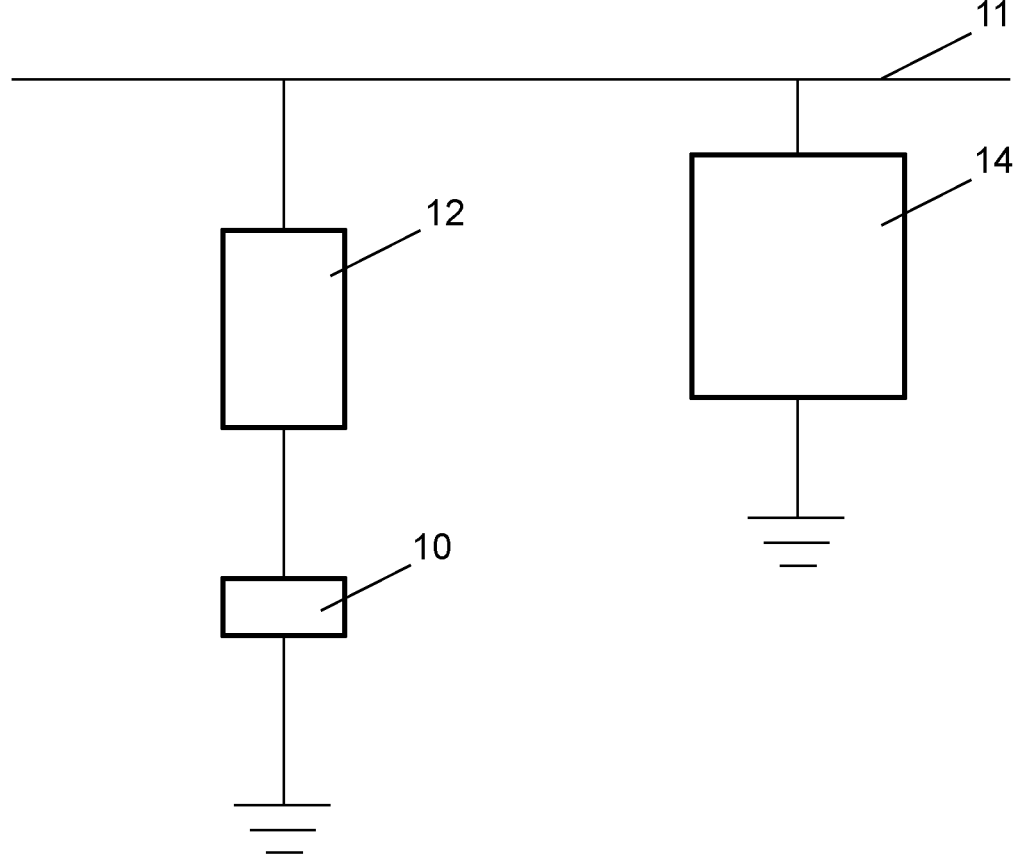
FIG. 1 is a schematic overview depicting a part of a power network comprising a monitoring arrangement according to some embodiments herein.

FIG. 1 schematically illustrates a part of a power network comprising a live wire 11 and an electrical equipment 14, for instance in the form of a transformer, connected to the live wire 11. The part of the power network further comprises a surge arrester 12 connected to the live wire 11 in order to protect the electrical equipment 14 against incoming surges in the live wire 11. The surge arrester 12 may be electrically connected to the live wire 11 by means of an electrical conductor. The surge arrester 12 may be connected to ground via electrical conductors. The power network may further comprise a circuit breaker. A monitoring arrangement 10 is connected to the surge arrester 12 in order to record monitoring data related to, e.g., the operation and condition of the surge arrester 12.

The monitoring arrangement 10 may comprise a surge counter to monitor the surges, specially the reignition surges that may occur after operation of the circuit breaker in the power network. The number of reignition surges a power equipment is subjected to may be recorded by means of a monitoring arrangement 10, which is connected to the grounding cable of the surge arrester 12. The surge counter may be configured as a reignition counter. The monitoring arrangement 10 gives information about the extent to which the installation is subjected to transient overvoltages and serves as a monitoring device for the surge arrester 12. The monitoring arrangement 10 may be sensitive to the charge content or amplitude of the impulse current through the surge arrester 12 caused by an incoming surge in the live wire to which the surge arrester is connected. Reignitions are transient overvoltages that may occur due to certain circuit breaker operations. Depending on the layout of a site, what type of load there is, power factor, and what type of circuit breaker is used, reignitions may occur when opening the circuit breaker. Reignitions may also generate severe overvoltages and on sites where conditions are unfavourable it can be advisable to use surge arresters to protect the electrical equipment such as transformers. Then it may also be desirable to monitor the actual occurrence of overvoltages due to reignitions.

Surges that occur due to reignitions have other characteristics than surges that occur due to lightning. Typically, surges due to reignitions occur much more frequently, several in a burst within very short time, and are lower in amplitude. Reignitions are characterised in that they typically start with small amplitude and that the amplitude usually increase for each reignition. This is due to larger and larger contact gap in the circuit breaker during its opening process. Reignitions are further characterised in that they occur with a large number within short time, e.g., in the range of 10-20 within 1 millisecond (ms). Furthermore, the reignitions are characterised in that if there is a surge arrester that finally limits the overvoltage due to the reignitions, the final current surge may have significantly longer duration than the previous ones.

Figure 2:
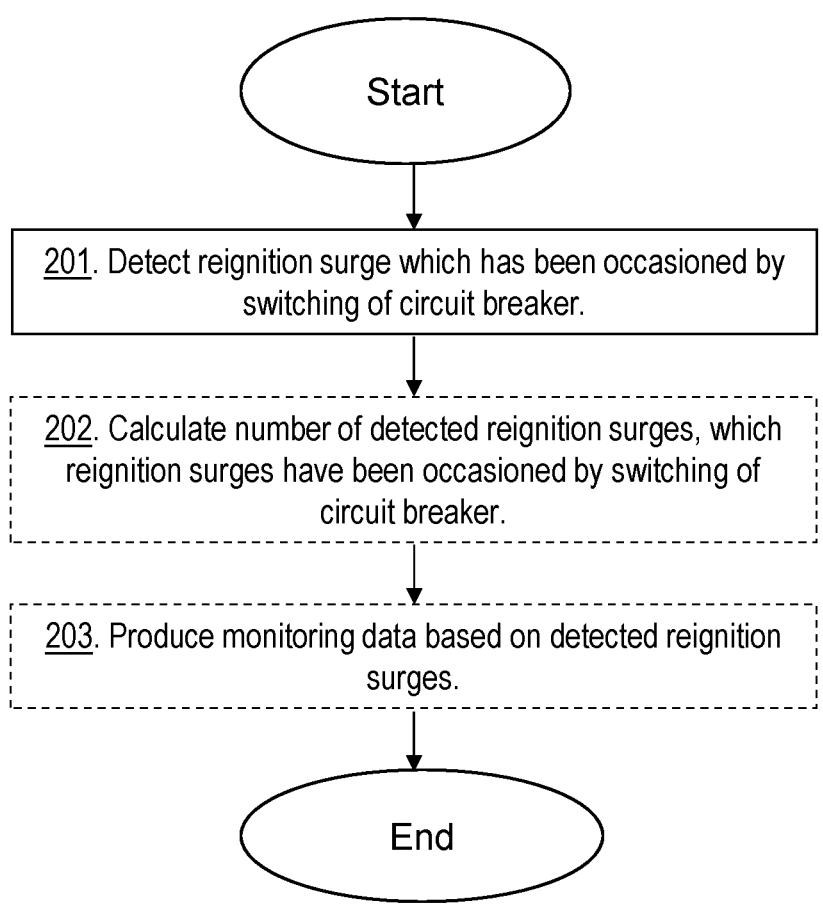
FIG. 2 is a flowchart depicting a method performed by a monitoring arrangement according to embodiments herein.

Some actions that may be performed by the monitoring arrangement 10 for monitoring the surge arrester 12 according to embodiments herein, will now be described with reference to a flowchart depicted in FIG. 2. The surge arrester 12 is connected to the power network in order to protect the electrical equipment 14 of the power network against incoming surges passing through the surge arrester 12. The power network may comprise a circuit breaker. The actions do not have to be taken in the order stated below but may be taken in any suitable order and more likely to be taking place concurrently. Optional actions that may be performed in some embodiments are marked with dashed boxes.

Action 201

According to embodiments herein it is significant to be able to count the number of reignition surges to analyse and collect information regarding the electrical supply condition the electrical equipment 14 is subjected to. Based on this information, the power network operator may decide whether the protection of the electrical equipment 14 needs to be improved, for example by increasing the number of surge arresters. The monitoring arrangement 10 therefore first detects the reignition surge, which reignition surge has been occasioned by a switching of the circuit breaker. The reignition surge counting may comprise obtaining, e.g., detecting, one or a plurality of current impulses. In an embodiment, the obtaining one or a plurality of current impulses may comprise obtaining samples of the current signal passing through the surge arrester 12 and processing the digitized samples to separate out the one or plurality of current impulses. The monitoring arrangement may comprise a wide band current sensor to measure the impulse current passing through the surge arrester 12 and an analog-to-digital (A/D) converter to sample and digitize the measured current impulse signals. In another embodiment, the obtaining one or a plurality of current impulses is performed with help of a digital counter circuitry that increments a count on electronic detection of a pulse and may provide an analogue or a digital reading of a representative magnitude value of impulses (e.g., peak value) observed in a particular period of time.

According to some embodiments the one or a plurality of current impulses such as reignition surges may occur before an activation of the surge arrester 12 i.e., before providing a low impedance path to the switching surge current. According to some embodiments the counting, e.g., obtaining, of the detected one or plurality of current impulse may be based on fulfilling a threshold condition, which threshold condition may be pre-configured.

The threshold condition may be a magnitude threshold condition to detect occurrence of an impulse (signal above a preconfigured noise level), a duration threshold condition to help separate out a reignition pulse i.e., to detect when a reignition pulse has ended to be able to distinguish one pulse from the another. The threshold conditions may also be configured as a percentage threshold condition, especially for the magnitude threshold as a percentage of the maximum magnitude that can be measured to detect a pulse above the noise band in the signal, for example 5% of 10V signal (max magnitude value).

According to an example the duration threshold is fulfilled when the current impulse is lasting less than 50 microseconds.

Action 202

The monitoring arrangement 10 then counts, e.g., calculates, the number of detected reignition surges, which reignition surges have been occasioned by the switching of said circuit breaker. The monitoring arrangement may comprise a surge counter such as a reignition counter, and the detection in action 201 and the counting may be performed by the reignition counter, which in an embodiment is a digital counter.

Action 203

The monitoring arrangement 10 produces monitoring data based on the detected reignition surges. The monitoring arrangement 10 may further comprise a processing unit, e.g., a processor or a controller, and the monitoring data based on the detected reignition surges may be performed by the processing unit. The processing unit can be used to coordinate and control the operation of the monitoring arrangement 10, and also to provide post processed information (e.g., time stamped surge magnitudes, or simply the count of reignition surges). The processing unit may further support suitable interface and communication modules to transfer the processed information to a user or another device for monitoring or further processing. In another embodiment, the processing of the digitized samples can be done offline by the other device to detect reignition surges and provide surge magnitude and count.

According to some embodiments, it would be valuable to install the monitoring arrangement 10 in any location where reignitions are likely to occur, e.g., in cable systems where vacuum circuit breakers frequently open during inductive load conditions or trip on inrush current. Especially on sites where there have been issues due to reignitions, the monitoring arrangement 10 would be valuable. This could be either to confirm the cause of issues or to demonstrate that appropriate action has been taken to solve the problem, for example installation of surge arresters that limit the voltage.

Embodiments herein relate to monitoring reignition surges, however, various types of surges may be monitored (for example surges due to restrikes caused by switching in a power network dominated with a capacitive load) by making suitable configuration arrangements (e.g., change in threshold conditions) with regard to detection of the impulses.

According to some embodiments the monitoring arrangement 10 may be able to produce data, i.e., provide data, in several forms. The data may comprise a detailed information where each reignition is provided with a time stamp and amplitude. The data may also comprise a summary information, stating e.g., that "within x ms", "y number of surges occurred", "they are likely to be due to reignitions" and "the surge arrester did/did not limit the overvoltage". See typical characteristics above. Comparison between the three phases can also give important information as to whether a so called virtual current chopping occurred or not. If virtual current chopping occurs, overvoltages may be significantly larger than if multiple reignitions without virtual current chopping occur.

The surge arrester 12 is a very non-linear impedance. At nominal operating conditions, i.e., when no surges are present, there is only a very small leakage current through the surge arrester, whereas when the surge arrester is limiting the voltage, it presents a very low impedance. When reignitions occur, the surge arrester 12 is usually still represented mainly by a capacitor. However, due to the presence of the capacitance of the surge arrester 12, there will be a small current surge through the surge arrester 12 every time a reignition occurs. It may therefore be useful to have a current detection device in the monitoring arrangement 10 which can capture surges of these characteristics, such as a Pearson wide-band current transformer or any wide band current sensor capable of measuring fast transients such as Rogowski coil, compensated resistor etc., to measure the current caused by the reignition surges through the surge arrester 12. The monitoring arrangement 10, thus detects/measures reignitions (count, amplitude, time stamp). A challenge is associated with detection of such fast transients occurring during reignition phenomenon for which a wide band current transformer is suggested as a part of the solution. The challenge is also in processing of reignition pulses, e.g., current impulses, as these pulses repeat within $\frac{1}{8}$th of power cycle (e.g., less than 2.5 ms for 50 Hz) and the data acquisition electronics has to digitize the signals fast enough to record the waveform of reignition pulses. Laboratory testing showing examples of embodiments herein will be further described below and which are illustrated with representative plots in FIGS. 3a-b through 6a-b. The laboratory tests have been performed in a 900 kVA three-phase 20 kV cable system, where a vacuum circuit breaker was opened during inductive load and surge arresters were installed to protect a transformer.

Figure 3A:
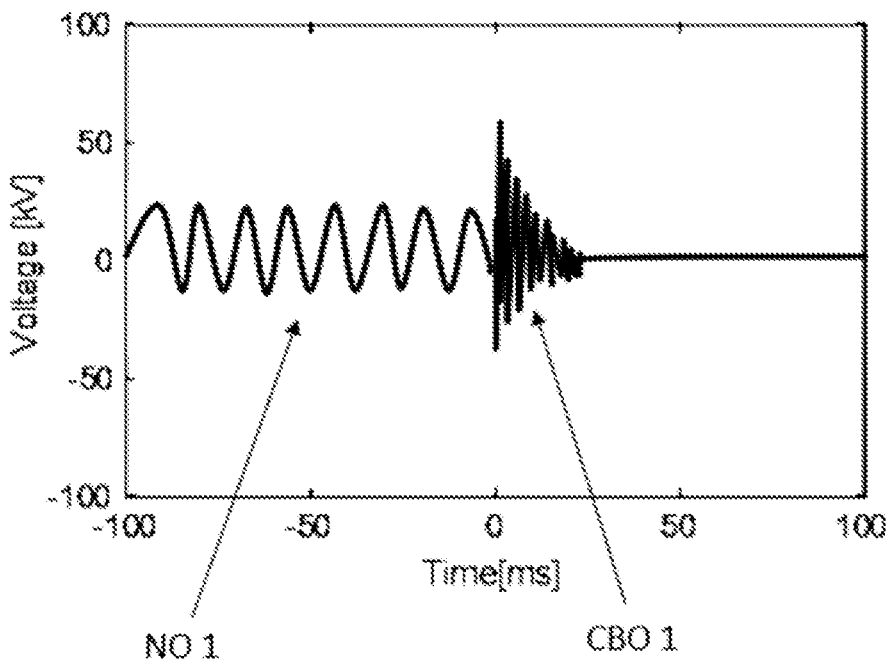
FIGS. 3a-b are diagrams depicting examples of measured voltages and currents from testing.

An example of voltages observed in the cable system during the occurrence of surge from laboratory testing is depicted in FIG. 3a, where voltage values have been plotted along a time axis. An overview of a circuit breaker opening event is thus illustrated, showing a first phase to ground voltage observed in the cable system. The normal applied voltage NO 1 is seen before the operation of the circuit breaker and after the opening of the circuit breaker CBO 1 overvoltage surges are observed in the cable system.

Figure 3B:
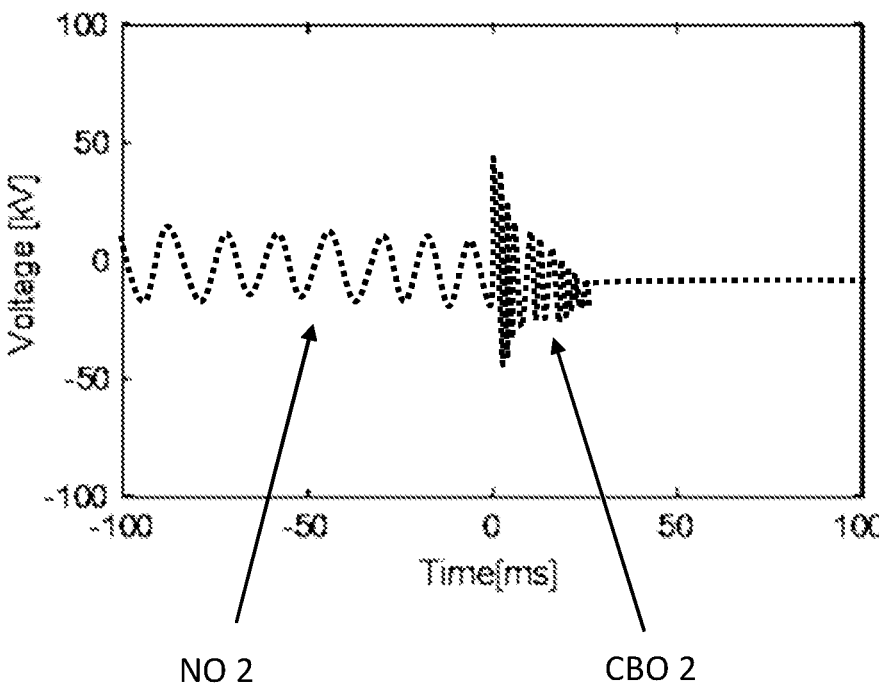

Another example of the overvoltage surge is depicted in FIG. 3b. The figure shows a second phase to ground voltage seen in the three-phase cable system during the circuit breaker opening event. At the normal operating conditions NO 2, it is shown a regular line voltage and after the opening of the circuit breaker CBO 2 an overvoltage surge can be seen. Similar overvoltage surges are also observed in the third phase of the cable system during the operation of the circuit breaker (not shown).

Figure 4A:
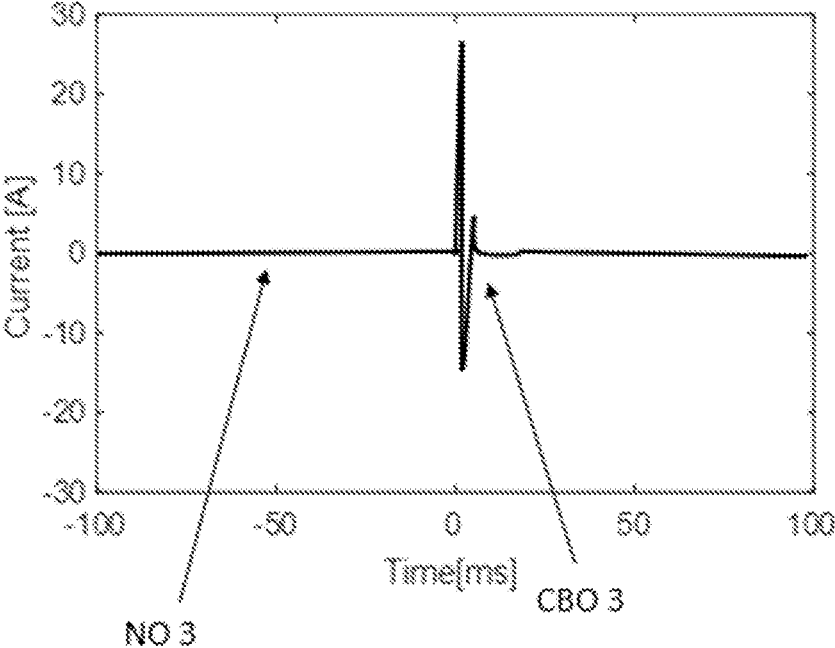
FIGS. 4a-b are further diagrams depicting examples of measured voltages and currents from testing.
Figure 4B:
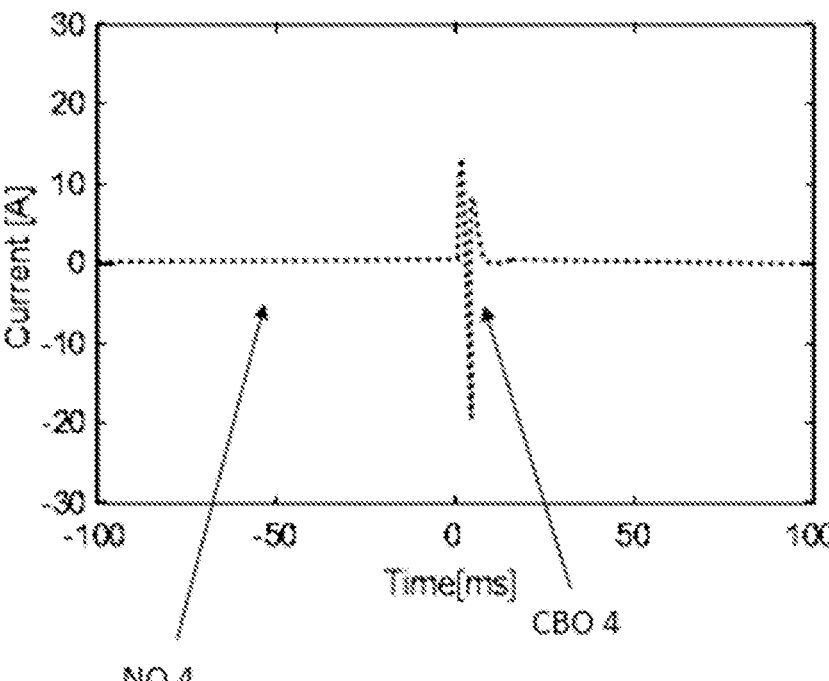

An example of measured surge currents from laboratory testing during opening of the circuit breaker are shown in FIG. 4a and FIG. 4b for monitoring surge currents through the surge arresters connected in two of the three phases of the cable system. An overview of a circuit breaker opening event is thus illustrated, showing current through the surge arresters connected in a first- and second phase of the three-phase cable system. During normal operating conditions NO 3 (FIG. 4a) and NO4 (FIG. 4b) there is small leakage current through the surge arresters connected in the respective phases. After the circuit breaker opening CBO 3 (FIG. 4a) and CBO 4 (FIG. 4b), the surge currents are observed as a pulse current through the surge arrester in the respective line (phase of the cable system). A typical surge monitoring device detects such pulses and counts them as switching surges. This is due to the characteristics of the current measurement in the monitoring arrangement of the typical surge monitoring device that counts switching or lightning surges, and it may not calculate more than maximum 2 surges per second.

Figure 5A:
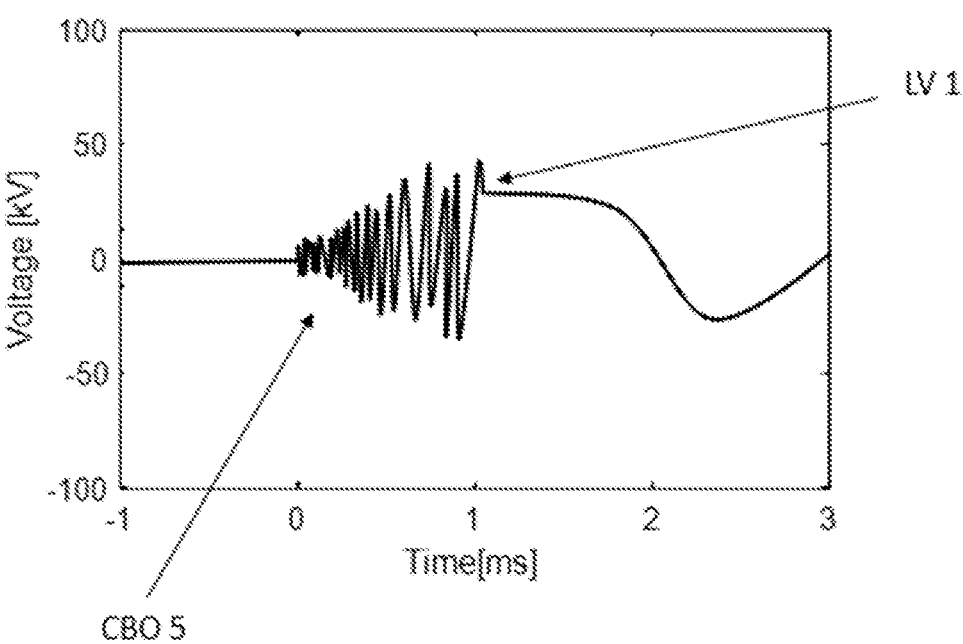
FIGS. 5a-b are further diagrams depicting examples of measured voltages and currents from testing.

The surge activities when observed in less than 1 millisecond (ms) time resolution shows presence of multiple surges caused by reignition. An example of measured voltages in a first phase of the cable system from the laboratory testing is depicted in FIG. 5a, where voltage values derived from a sequence of sampled digital signals have been plotted along a time axis. During circuit breaker opening CBO 5 reignitions occur. The reignitions may occur with larger and larger amplitude during about 1 ms. Each reignition surge (overvoltage) generates a capacitive current surge, through the surge arrester. Finally, when the surge arrester starts limiting the voltage LV 1, a current pulse of longer duration occurs.

Figure 5B:
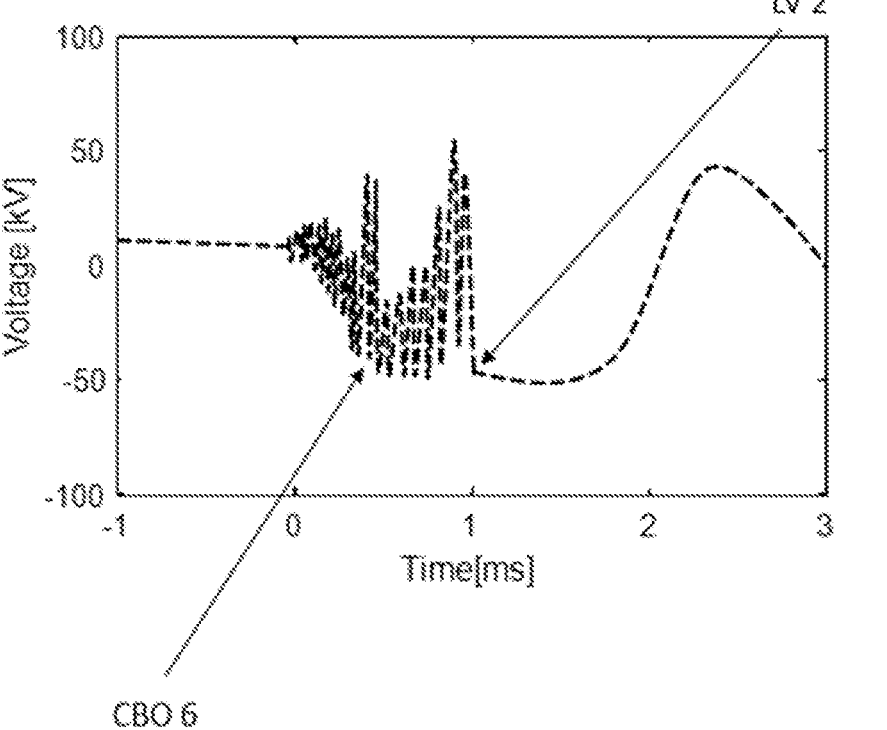

Another example of measured voltages from laboratory testing at the second phase of the cable system is depicted in FIG. 5b, where voltage values also depicting the reignition surges occurring from the circuit breaker opening CBO 6 limiting of the overvoltage LV 2.

Figure 6A:
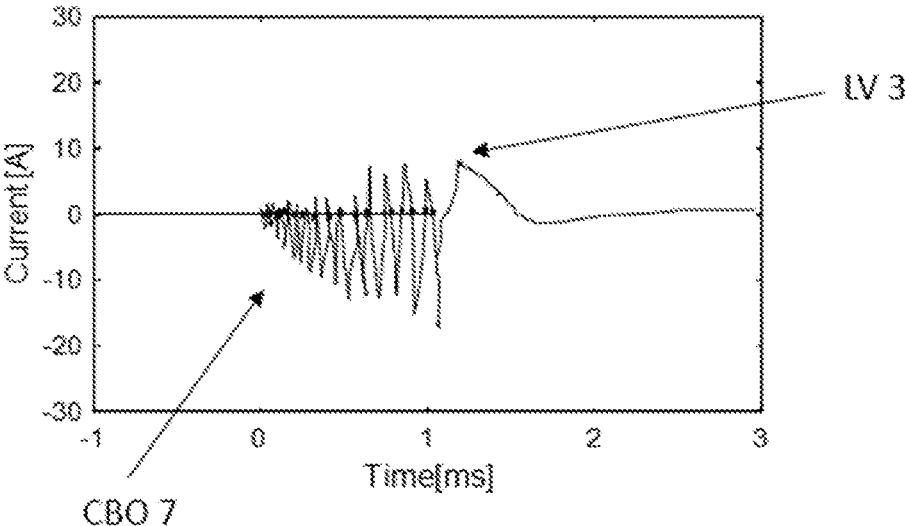
FIGS. 6a-b are further diagrams depicting examples of measured voltages and currents from testing.

An example of measured reignition surge currents through a surge arrester connected in a first phase of the three-phase cable system from the laboratory testing is shown in FIG. 6a, where current values derived from a sequence of digital signals sampled with a fast A/D converter have been plotted along a time axis. The surge current through the surge arrester was measured with an external Pearson wideband current transformer. During circuit breaker opening CBO 7 reignitions occur with surges of larger and larger amplitude during about 1 ms. Each reignition surge generates a capacitive current surge of significant amplitude, through the surge arrester and finally, when the surge arrester starts limiting the voltage LV 3, a current pulse of longer duration occurs.

Figure 6B:
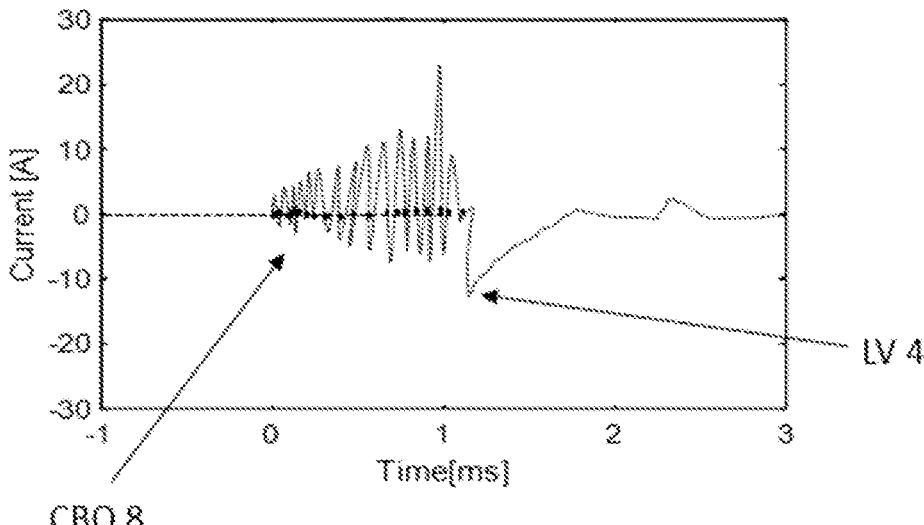

Another example of measured reignition surge currents through the surge arrester connected to the second phase of the cable system from laboratory testing is shown in FIG. 6b. The occurrence of reignition surges during opening of circuit breaker CBO 8 is depicted along with the instant when the surge arrester starts limiting the voltage LV 4, which results in a current pulse of longer duration. Using a current measurement with characteristics such as e.g., a Pearson wide-band current transformer or similar however, similar results as shown in FIGS. 5a-b and 6a-b may be obtained, and the occurrence of reignitions may be detected. The measurement arrangement with characteristics such as a Pearson wide-band current transformer can be an additional arrangement specifically for measurement reignition surges along with a measurement arrangement made for switching or/and lightning surges.

According to an example of embodiments herein, a monitoring arrangement 10, which may comprise a reignition counter, may be connected with the wide band current sensor and may measure the current signal (sampling and digitizing the current signal) or detect and count the reignition pulses with a digital counter. The monitoring arrangement 10 has the capability to detect bursts of pulses (for e.g., with around 1 microsecond or faster sampling rate) within the 1 ms time period or with a proper wave shaping of the detected pulses by the current sensor and counting of the pulses with a digital counter.

In an embodiment with a fast analog to digital converter to sample the pulses, the sampled data may be processed with e.g., a processor to detect a number of reignition pulses, e.g., current impulses, which may be identified as a burst of pulses occurring after operation of the circuit breaker until the surge arrester 12 is activated. The events, pulse count and magnitude may be identified from the sampled current waveshape. In embodiments herein, the monitor arrangement 10 is also capable of detecting reignition surges occurring before activation of the surge arrester and to verify if the surge arrester 12 was activated at around the protection level (overvoltage) designed for activation of the surge arrester 12. Such determination can be carried out by processing of the sampled current signals through the surge arrester 12.

According to another example of embodiments herein the monitoring arrangement 10 in addition may be capable of capturing switching/lightning surges as the waveform from the wide band current signal will also respond to the current waveform of switching/lightning surges and identification of these switching/lightning surges can be done through processing of the captured waveform data.

Figure 7:
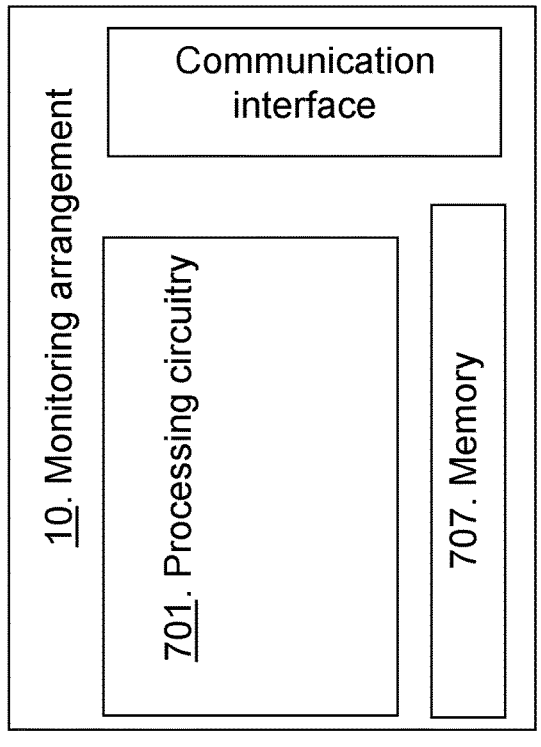
FIG. 7 is a schematic block diagram illustrating a network node according to some embodiments herein.

To perform the method actions above for monitoring the surge arrester 12 the monitoring arrangement 10 may comprise the block diagram depicted in FIG. 7.

The monitoring arrangement 10 may comprise processing circuitry 701, e.g., one or more processors, configured to perform the methods herein.

The monitoring arrangement 10 may comprise a detecting unit 702. The monitoring arrangement 10, the processing circuitry 701, and/or the detecting unit 702 are configured to detect the reignition surge, which reignition surge has been occasioned by a switching of said circuit breaker. The detecting the reignition surge may comprise obtaining, e.g., detecting, one or a plurality of current impulses. In an embodiment, the obtaining of one or a plurality of current impulses is carried out with help of a pulse wave shaping electronic circuitry. The one or a plurality of current impulses may occur before an activation of the surge arrester. In some embodiments, the obtaining one or a plurality of current impulses may comprise obtaining samples and processing the samples to separate out the one or plurality of current impulses. The monitoring arrangement 10 may further comprise the A/D converter and the samples are obtained by the A/D converter. The detecting the one or plurality of current impulses may be based on fulfilling a threshold condition, which threshold condition may be pre-configured.

The monitoring arrangement 10 may comprise a calculating unit 703. The monitoring arrangement 10, the processing circuitry 701, and/or the calculating unit 703 may be configured to calculate, e.g., count, the number of detected reignition surges, which reignition surges have been occasioned by the switching of said circuit breaker.

The monitoring arrangement 10 may comprise a producing unit 704. The monitoring arrangement 10, the processing circuitry 701, and/or the producing unit 704 may be configured to produce monitoring data based on the detected reignition surges.

The monitoring arrangement 10 further comprises a memory 707. The memory 707 comprises one or more units to be used to store data on, such as current impulses, reignition surge information, measurements and observations made by monitoring arrangements and/or sensors, input/output data, metadata, etc. and applications to perform the methods disclosed herein when being executed, and similar. The monitoring arrangement 10 may further comprise a communication interface.

The methods according to the embodiments described herein for the monitoring arrangement 10 are respectively implemented by means of e.g., a computer program product 708 or a computer program, comprising instructions, i.e., software code portions, which, when executed on at least one processor, cause the at least one processor to carry out the actions described herein, as performed by the monitoring arrangement 10. The computer program product 708 may be stored on a computer-readable storage medium 709, e.g., a disc, a universal serial bus (USB) stick or similar. The computer-readable storage medium 709, having stored thereon the computer program product, may comprise the instructions which, when executed on at least one processor, cause the at least one processor to carry out the actions described herein, as performed by the monitoring arrangement 10. In some embodiments, the computer-readable storage medium may be a transitory or a non-transitory computer-readable storage medium.

As will be readily understood by those familiar with communications design, that functions means or circuits may be implemented using digital logic and/or one or more microcontrollers, microprocessors, or other digital hardware. In some embodiments, several or all of the various functions may be implemented together, such as in a single application-specific integrated circuit (ASIC), or in two or more separate devices with appropriate hardware and/or software interfaces between them. Several of the functions may be implemented on a processor shared with other functional components of a UE or network node, for example.

Alternatively, several of the functional elements of the processing units discussed may be provided through the use of dedicated hardware, while others are provided with hardware for executing software, in association with the appropriate software or firmware. Thus, the term "processor" or "controller" as used herein does not exclusively refer to hardware capable of executing software and may implicitly include, without limitation, digital signal processor (DSP) hardware and/or program or application data. Other hardware, conventional and/or custom, may also be included. Designers of communications devices will appreciate the cost, performance, and maintenance trade-offs inherent in these design choices.

It is to be noted that any feature of any of the aspects may be applied to any other aspect, wherever appropriate. Likewise, any advantage of any of the aspects may apply to any of the other aspects.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

It will be appreciated that the foregoing description and the accompanying drawings represent non-limiting examples of the method and winding arrangement taught herein. As such, the winding arrangement and techniques taught herein are not limited by the foregoing description and accompanying drawings. Instead, the embodiments herein are limited only by the following claims and their legal equivalents.

The invention claimed is:

1. A monitoring arrangement for monitoring a surge through a surge arrester, said surge arrester being adapted to be connected to a power network in order to protect an electrical equipment of the power network against incoming surges passing through the surge arrester, wherein the monitoring arrangement is adapted to:
   detect a reignition surge, which reignition surge has been occasioned by a switching of a circuit breaker.

2. The monitoring arrangement according to claim 1, wherein the monitoring arrangement is further adapted to:
   calculate the number of detected reignition surges, which reignition surges have been occasioned by the switching of said circuit breaker.

3. The monitoring arrangement according to claim 1, wherein the monitoring arrangement is adapted to detect the reignition surge by obtaining one or a plurality of current impulses.

4. The monitoring arrangement according to claim 3, wherein the obtaining one or a plurality of current impulses comprises obtaining digitized samples and processing the samples to separate out the one or plurality of current impulses.

5. The monitoring arrangement according to claim 3, wherein the one or a plurality of current impulses occur before an activation of the surge arrester.

6. The monitoring arrangement according to claim 3, wherein obtaining the one or plurality of current impulses is based on fulfilling a threshold condition for detection of the one or plurality of current impulses.

7. The monitoring arrangement according to claim 6, wherein the threshold condition is any one out of: a duration threshold condition, a magnitude threshold condition and/or a percentage threshold condition.

8. The monitoring arrangement according to claim 1, wherein the monitoring arrangement is further adapted to produce monitoring data based on the detected reignition surges.

9. A method performed by a monitoring arrangement for monitoring a surge through a surge arrester, said surge arrester being connected to a power network in order to protect an electrical equipment of the power network against incoming surges passing through the surge arrester, the method comprising:
   detecting a reignition surge, which reignition surge has been occasioned by a switching of a circuit breaker.

10. The method according to claim 9, further comprising:
   calculating the number of detected reignition surges, which reignition surges have been occasioned by the switching of said circuit breaker.

11. The method according to claim 9, wherein detecting the reignition surge comprises obtaining one or a plurality of current impulses.

12. The method according to claim 11, wherein the obtaining one or a plurality of current impulses comprises obtaining digitized samples and processing the samples to separate out the one or plurality of current impulses.

13. The method according to claim 9, wherein the one or a plurality of current impulses occur before an activation of the surge arrester.

14. The method according to claim 11, wherein the detecting of one or plurality of current impulses includes detecting of at least one current impulse that is lasting less than 50 microseconds.

15. The method according to claim 9, further comprising:
producing monitoring data based on the detected reignition surges.

* * * * *